United States Patent
Olesiewicz et al.

(10) Patent No.: US 7,733,641 B2
(45) Date of Patent: *Jun. 8, 2010

(54) HARD DISK DRIVE LEVER WITH BUTTON-INDUCED EJECTION, AND OVER-TRAVEL BUTTON-INDUCED EJECTION, AND OVER-TRAVEL INDICATOR

(75) Inventors: Timothy W. Olesiewicz, Dublin, CA (US); Brett C. Ong, San Jose, CA (US); William A. De Meulenaere, Newark, CA (US)

(73) Assignee: Oracle America, Inc., Redwood Shores, CA (US)

( * ) Notice: Subject to any disclaimer, the term of this patent is extended or adjusted under 35 U.S.C. 154(b) by 302 days.

This patent is subject to a terminal disclaimer.

(21) Appl. No.: 11/899,176

(22) Filed: Sep. 5, 2007

(65) Prior Publication Data

US 2008/0266780 A1    Oct. 30, 2008

Related U.S. Application Data

(63) Continuation-in-part of application No. 11/789,611, filed on Apr. 25, 2007.

(51) Int. Cl.
*G06F 1/16* (2006.01)
(52) U.S. Cl. .......................... 361/679.34; 360/97.02; 358/1.15; 710/311; 713/323

(58) Field of Classification Search ............... 358/19, 358/1.5; 360/244.3, 97.02; 248/71, 639, 248/694; 710/302, 311; 713/323; 361/679.33, 361/679.34, 679.35, 679.36, 679.43, 679.54
See application file for complete search history.

(56) References Cited

U.S. PATENT DOCUMENTS

| 7,532,439 | B2* | 5/2009 | Byun et al. | 360/256.4 |
| 7,535,704 | B2* | 5/2009 | Olesiewicz et al. | 248/639 |
| 2009/0168243 | A1* | 7/2009 | Luo | 360/133 |

* cited by examiner

*Primary Examiner*—Hung V Duong
(74) *Attorney, Agent, or Firm*—Osha • Liang LLP

(57) ABSTRACT

A hard disk drive bracket including a bezel, a lever arm attached to the bezel rotatably between a closed position against the bezel and an open position apart from the bezel, and a unitarily formed body attached to the bezel. The lever arm includes an extension on the rotating end. The unitarily formed body includes a locking member adapted to secure the lever arm in the closed position and a release button arranged to release the locking member when the release button is depressed. The unitarily formed body may be adapted to serve as a horn attached to the bezel rotatably between a natural position in which the locking member impedes the path of the lever arm, and a forced position in which the locking member is clear of the path of the lever arm.

12 Claims, 8 Drawing Sheets

HARD DISK DRIVE LEVER WITH BUTTON-INDUCED EJECTION, AND OVER-TRAVEL BUTTON-INDUCED EJECTION, AND OVER-TRAVEL INDICATOR

CROSS-REFERENCE TO RELATED APPLICATIONS

This application is a continuation-in-part application of U.S. patent application Ser. No. 11/789,611 filed Apr. 25, 2007, entitled "Auto-Depress Disk Drive Bracket Mechanism" with the same inventors and having common ownership.

BACKGROUND OF INVENTION

Hard disk drive brackets come in many shapes and forms. Most of today's brackets are designed to accommodate standard 3.5" drives. Examples of hard disk drives brackets abound. Some examples of the hard disk drive brackets utilized in past products developed by Sun Microsystems, Inc. are shown in FIGS. 1-3 and described below.

FIGS. 1(a) and 1(b) show a 3.5" Hard Disk Drive (HDD) 911 bracket referred to as "SPUD" in closed and open positions, respectively. In the "SPUD," a spring 913 is utilized to bias the door 915 outward, and has a side actuated latch release 917.

FIGS. 2(a) and 2(b) show a 3.5" HDD bracket 921 referred to as "SPUD 3" in closed and open positions, respectively. In the "SPUD 3," a side-sliding latch release 927 and lever-arm spring 923 are included in order to swing the door 925 outward.

FIGS. 3(a) and 3(b) show a 3.5" HDD bracket 931 used in, for example, a "Sun Fire V20z" server. In this bracket 931, the release latch 937 is still a side action, but has been integrated into the lever arm 935.

SUMMARY OF THE INVENTION

In one or more embodiments of the present invention, a hard disk drive bracket comprises a bezel, a lever arm attached to the bezel rotatably between a closed position against the bezel and an open position apart from the bezel, a release mechanism attached to the bezel comprising a locking member that latches the lever arm in the closed position and a release button arranged to unlatch the lever arm from the locking member when the release button is depressed, and a horn attached to the bezel translatably between a natural position apart from the release mechanism and a forced position that allows the horn and release mechanism to interact to free the locking member from the path of the lever arm.

Other aspects and advantages of the invention will be apparent from the following description and the appended claims.

DETAILED DESCRIPTION

New generations of server platforms incorporate small form factor (SFF) 2.5" hard disk drives. Therefore, in accordance with one or more embodiments of the present invention, a new 2.5" hard disk drive (HDD) bracket was developed to serve as a common drive bracket for future product platforms incorporating swappable, 2.5" hard disk drives. Embodiments of the present invention will be described below with reference to the drawings.

In order to support a multitude of HDD mounting applications across different products, the mechanical packaging requirements of the bracket are very constrained. In particular, because of the requirements for width and depth dimensions (e.g., for standard 78 mm×115 mm dimensions), little room is left for the bezel, mounting rails, and latch/release mechanism. In an application with such dimensions, only 8 mm of packaging depth is allowed at the front of the bracket for the front bezel, lever/locking arm, push button release, and latch. Accordingly, one or more embodiments of the present invention provide a bracket with a unique, low profile, low cost, and robust mechanism with parts that are resilient to manufacturing variations.

Figure 1A:
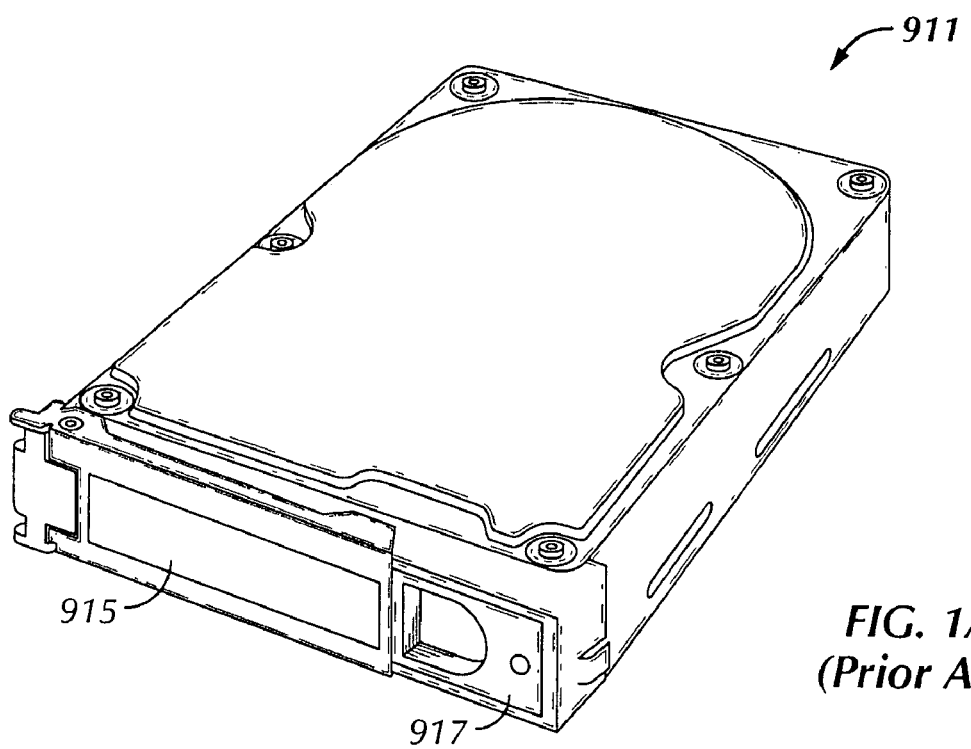
FIGS. 1(a) and 1(b) show a "SPUD" 3.5" HDD bracket.
Figure 1B:
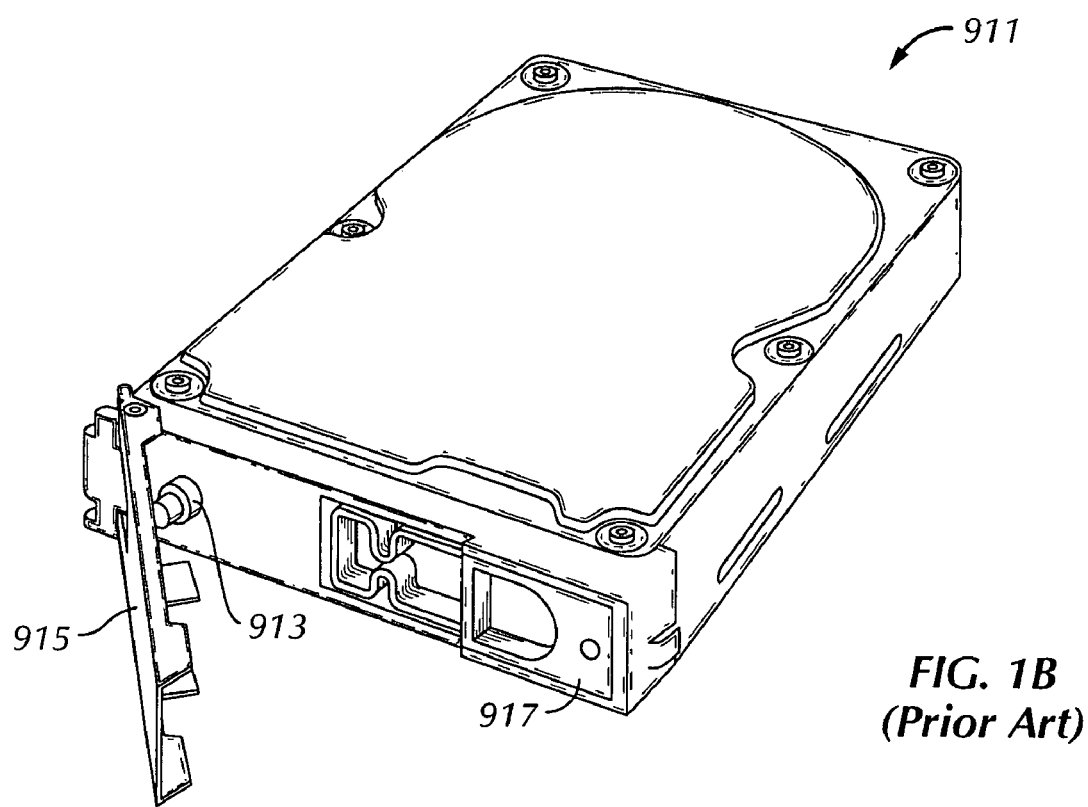
Figure 2A:
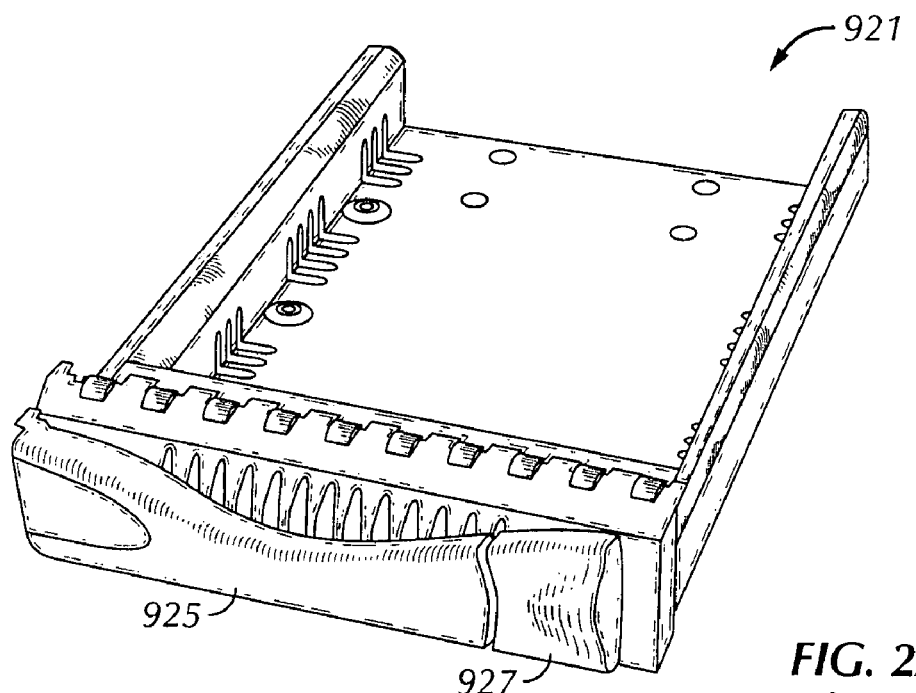
FIGS. 2(a) and 2(b) show a "SPUD 3" 3.5" HDD bracket.
Figure 2B:
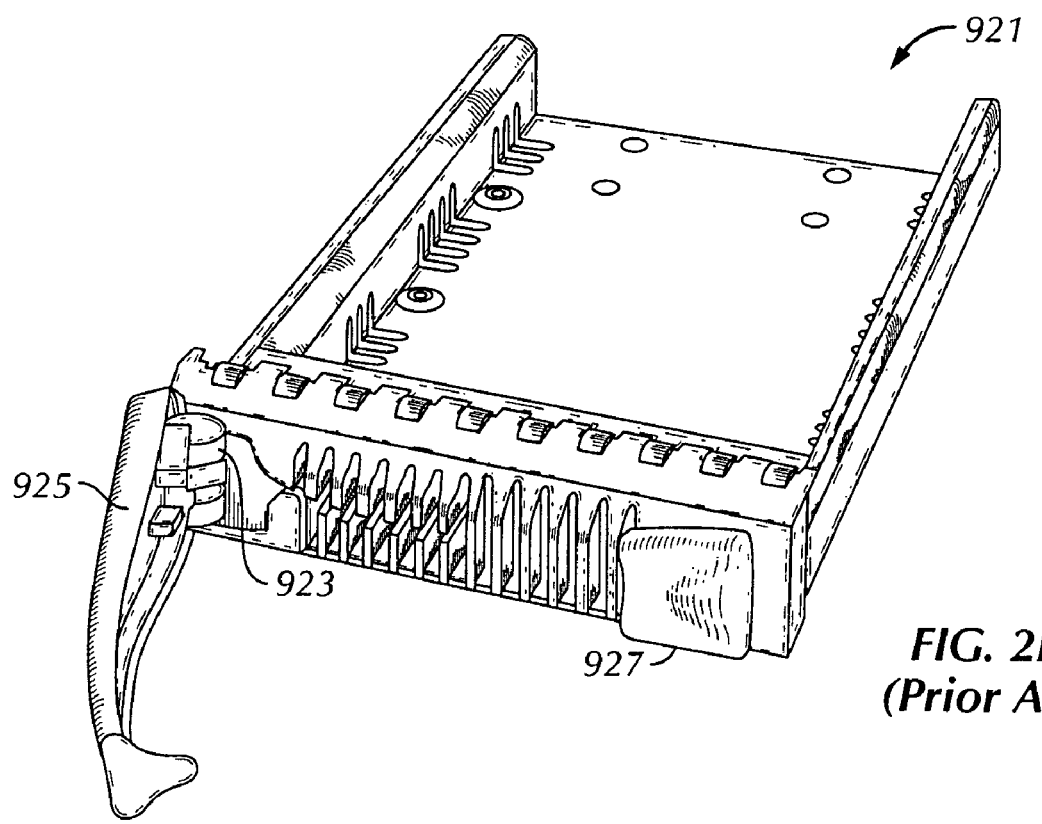
Figure 3A:
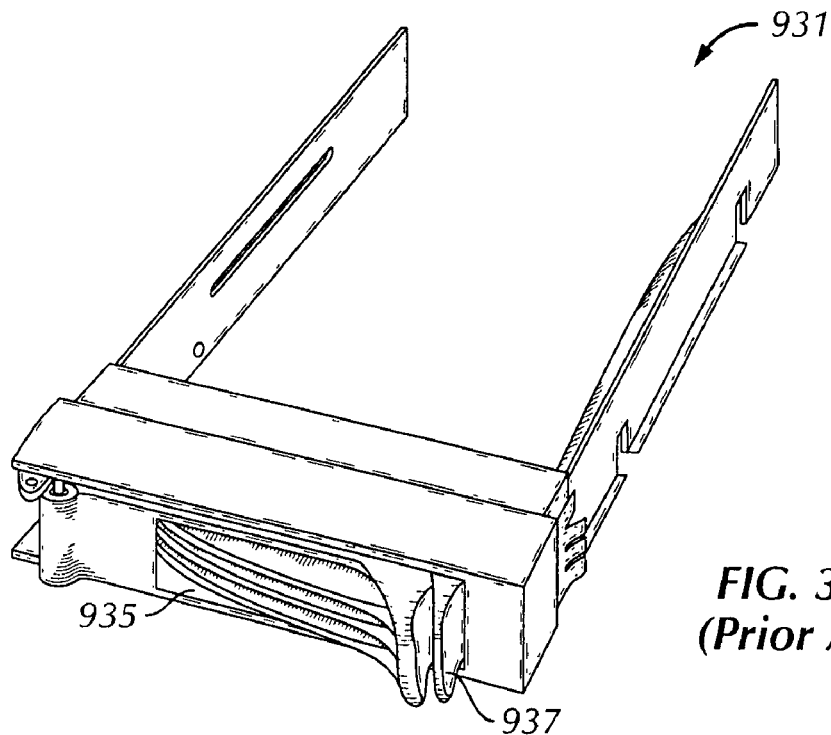
FIGS. 3(a) and 3(b) show a 3.5" HDD bracket used in, for example, a "Sun Fire V20z" server.
Figure 3B:
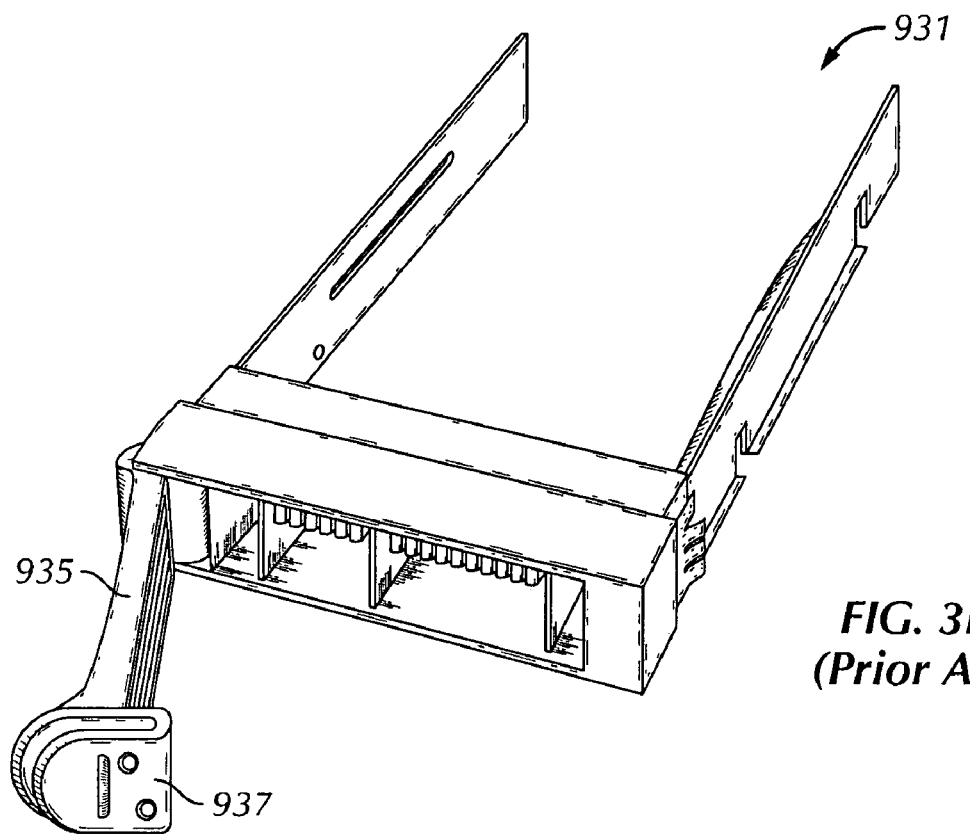
Figure 4A:
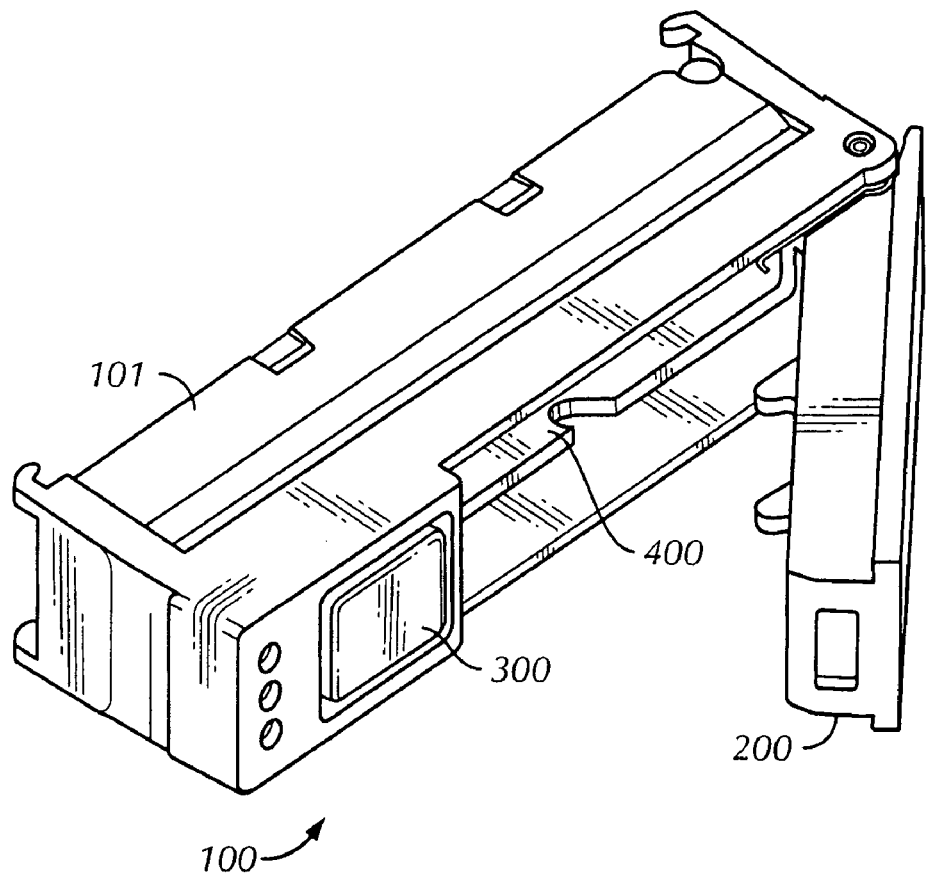
FIGS. 4(a) and 4(b) show front views of a HDD bracket in accordance with an embodiment of the present invention.
Figure 4B:
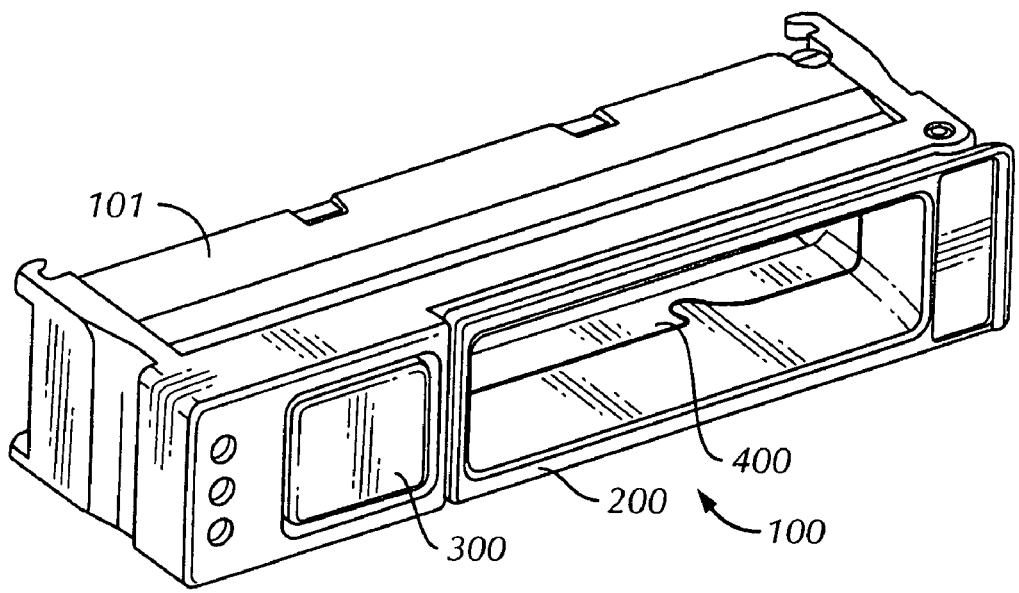

Referring to FIGS. 4(a) and 4(b), a front facing view of a HDD bracket 100 according to an embodiment of the present invention is shown. The HDD bracket 100 has a front bezel 101, on which lever arm 200, release mechanism 300, and horn 400 are disposed. FIG. 4(b) shows the lever arm 200 in the latched ("closed") position. To operate the HDD bracket 100, the user presses the release mechanism 300 and the lever arm 200 releases and automatically springs outward into the unlatched ("open") position as in 4(a). The user then inserts or removes a hard disk drive from the bracket and then closes the lever arm 200 to lock the hard disk drive in place.

Figure 5A:
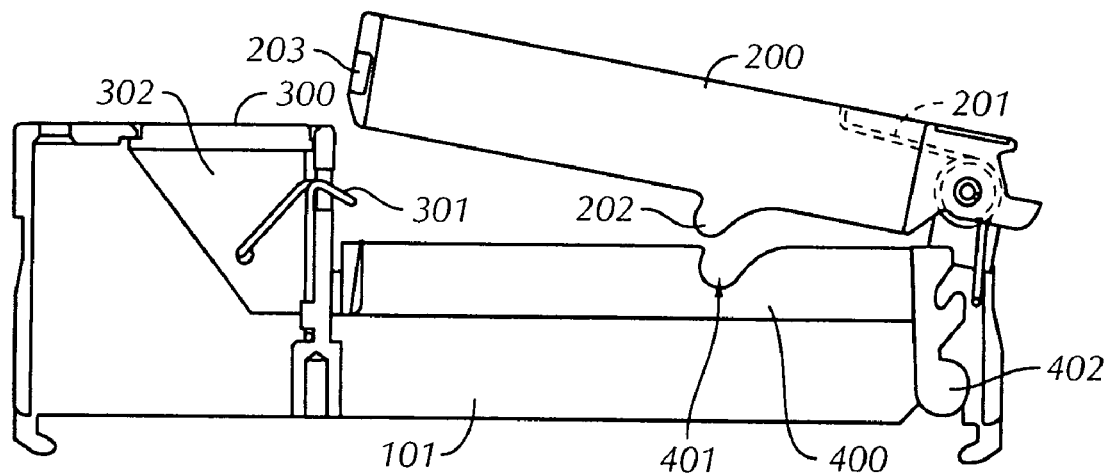
FIGS. 5(a), 5(b), and 5(c) show top views from inside of a HDD bracket in accordance with an embodiment of the present invention.

FIG. 5(a) shows a HDD bracket from the top view inside the bezel 101 with the lever arm 200 in the unlatched position. In the unlatched position the lever arm 200 is rotated apart from the bezel 101, the release mechanism 300, and the horn 400. The spring 201 biases the lever arm 200 to the unlatched position. The release button 302 is biased outward by the locking member 301 when the lever arm 200 is in the unlatched position. The horn 400 is in the horn's natural position and does not interact with any other elements when the lever arm 200 is in the unlatched position.

Figure 5B:
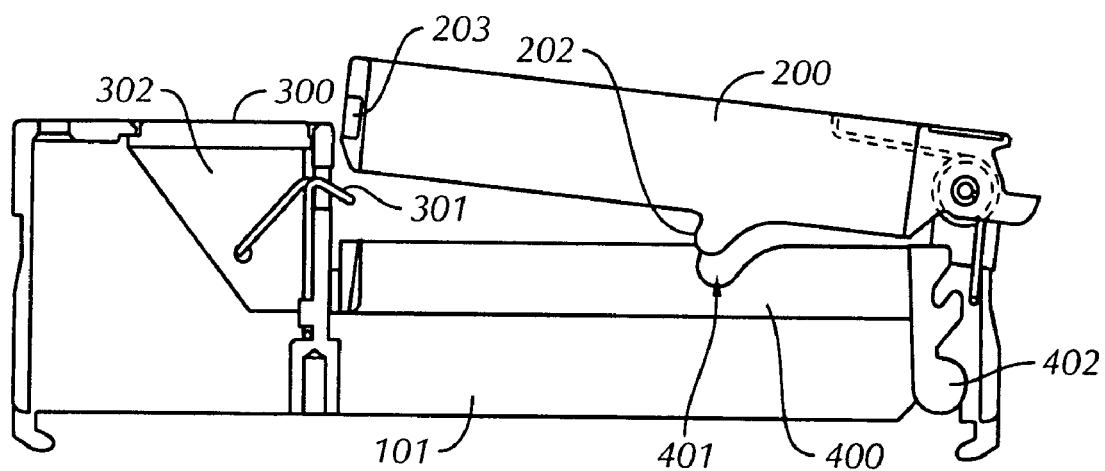

FIG. 5(b) shows a HDD bracket from the top view inside the bezel 101 as the lever arm 200 is rotating between the open and closed positions. Specifically, FIG. 5(b) shows a HDD bracket as a protrusion 202 from the lever arm 200 makes contact with the horn 400. In one or more embodiments, the distance from the slotted end 203 to the protrusion 202 is around 27 mm. The horn 400 is a mechanism attached to the bezel 101 translatably between the horn's natural position as shown in FIG. 5(a) and the horn's forced position shown in FIG. 5(b). The contact between the lever arm 200 and the horn 400 shown in FIG. 5(b) forces the horn to move from the horn's natural position to the horn's forced position. The horn comprises a cavity 401 and a pivot 402. The cavity 401 serves the purpose of allowing contact between the horn 400 and the protrusion 202 from the lever arm 200, thereby converting the force of closing the lever arm 200 into movement of the horn 400 from the horn's natural position to the horn's forced position. Thus, the combination of the lever arm 200, protrusion 202, cavity 401, and horn 400 serve as a cam to translate motion of the lever arm 200 into motion of the horn 400. The pivot 402 is adapted to attach the horn 400 to the bezel 101 so as to allow motion of the horn 400 between the horn's forced and natural positions.

FIG. 5(b) shows the interaction between the horn 400 and the release mechanism 300 in addition to the contact between the horn 400 and the lever arm 200. As the horn 400 is forced from the horn's natural position to the horn's forced position as the lever arm 200 is closing, the horn 400 interacts with the release mechanism 300 to automatically depress the release button 302. FIG. 5(b) shows horn 400 in the horn's forced position, thereby making contact with the release mechanism 300 and depressing the release button 302. The purpose of depressing the release button 302 during the closing of the lever arm 200 is to clear the locking member 301 from the path of the lever arm 200. Clearing the locking member 301 from the path of the lever arm 200 allows for smooth and consistent operation of a HDD 100.

Figure 5C:
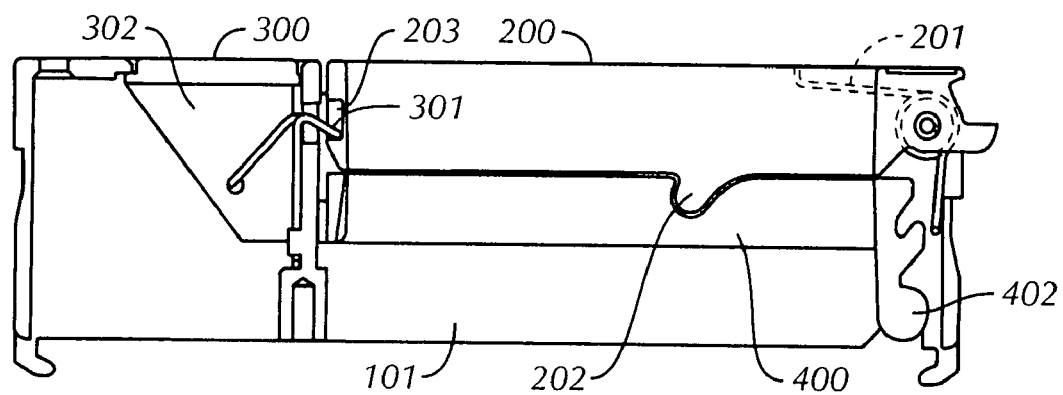

FIG. 5(c) shows a HDD bracket from the top view inside the bezel 101 when the lever arm 200 is in the latched position. When the lever arm 200 is in the latched position, the shapes of the cavity 401 (as shown in FIG. 5(b)) and protrusion 202 allow the horn 400 to return to the horn's natural position in which the horn 400 does not interact with the release mechanism 300. Thus, the release button 302 is again biased outward, and the locking member 301 impedes the path of the lever arm 200. In the latched position, the locking member 301 is captured by the slotted end 203 of the lever arm 200, thereby securing the lever arm 200 closed. In addition to allowing the horn 400 to return to the horn's natural position, the shapes of the cavity 401 (as shown in FIG. 5(b)) and protrusion 202 also help to secure the lever arm 200 in the closed position. In an alternative embodiment of the present invention, the interaction between the horn's cavity 401 (as shown in FIG. 5(b)) and the lever arm's protrusion may serve as the locking member 301, thus eliminating the need for a separate embodiment of the locking member.

Figure 6:
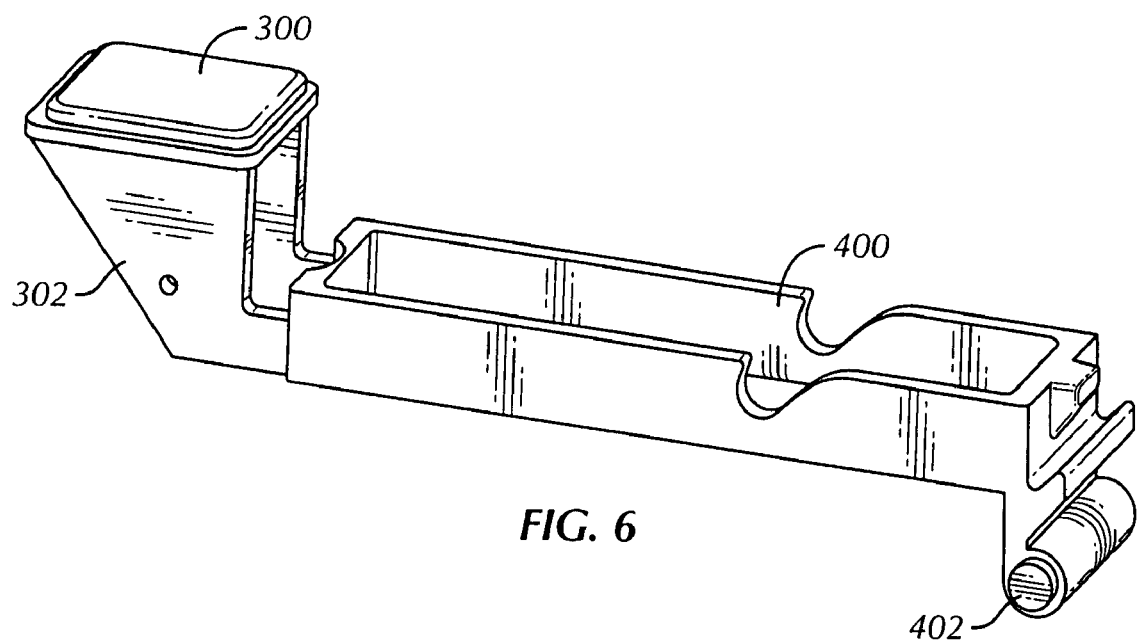
FIG. 6 shows a unitarily formed release button, horn, and pivot in accordance with an embodiment of the present invention.
Figure 7A:
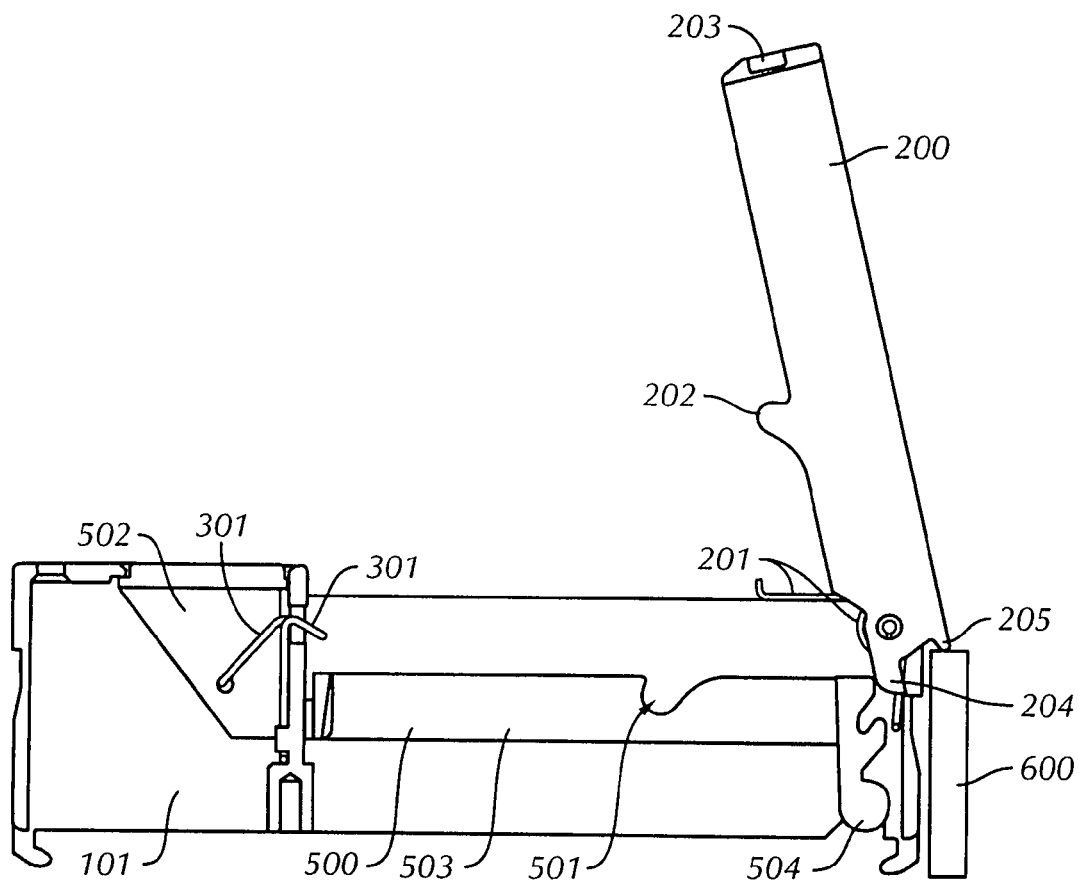
FIGS. 7(a), 7(b), and 7(c) show top views from inside of a HDD bracket in accordance with an embodiment of the present invention.
Figure 7B:
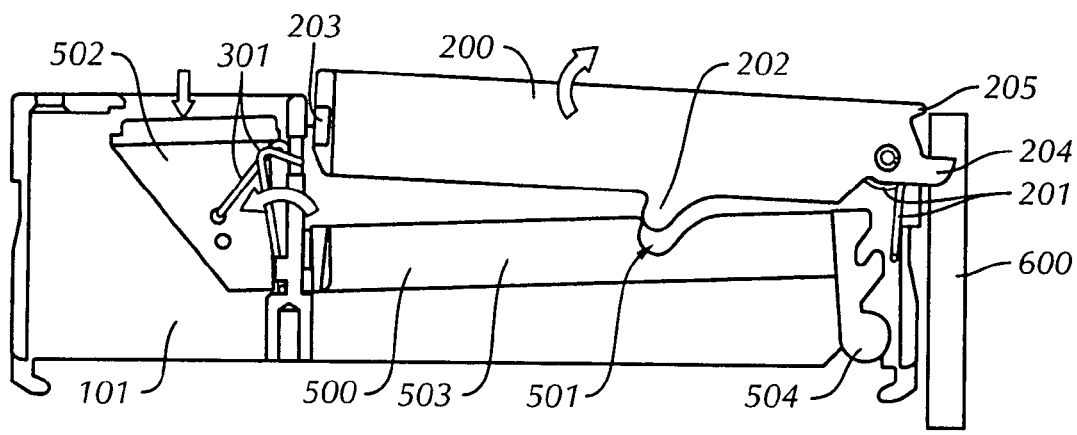
Figure 7C:
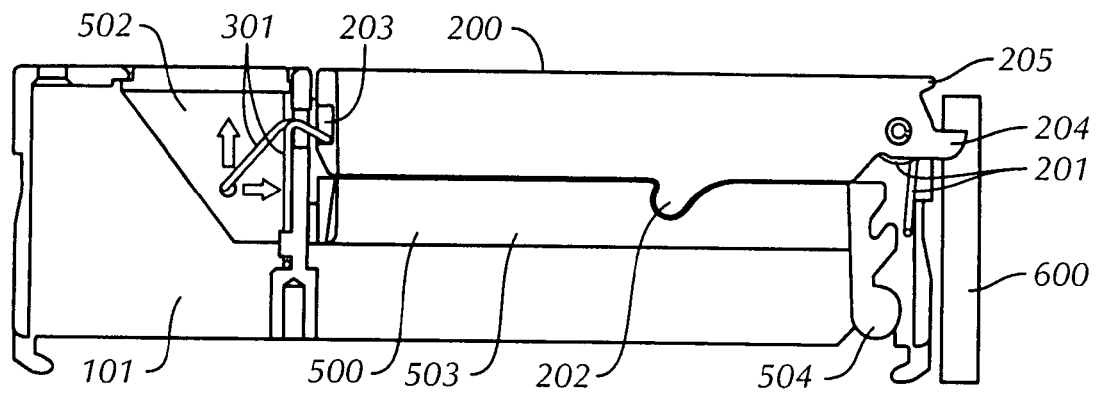

In one or more embodiments of the present invention, the release mechanism may be a unitarily formed body comprising the release button, horn, and pivot. FIG. 6 shows one such embodiment of the release mechanism 300. FIGS. 7(a), 7(b), and 7(c) show the unitarily formed body in relation to the other features of the invention. Advantages of this embodiment include further reduction of part count in the invention as a whole and more reliable operation of the invention.

In an embodiment according to FIGS. 7(a), 7(b), and 7(c), a unitarily formed body 500 has a natural and forced position based on the interaction with the locking member 301. The natural position is upward and the button end of the unitarily formed body is biased outwards, while the locking member is biased to impede the path of the lever arm. The locking member comprises a wireform shaped such that in its natural position the unitarily formed body is biased upward by the wireform. When the lever arm is in the unlatched position, the locking member and unitarily formed body are in the natural position, and the locking member supplies a biasing force that resists movement in the unitarily formed body. The biasing force supplied by the locking member also supplies the force necessary to keep the lever arm from opening past its maximal position.

FIG. 7(a) shows a HDD bracket 100 with a unitarily formed body 500 comprising the release button 502, horn 503, and pivot 504 from the top view inside the bezel 101 when the lever arm 200 is in the unlatched position. In the unlatched position the lever arm is rotated apart from the bezel and the unitarily formed body. A spring 201 disposed in the lever arm and attached to the bezel biases the lever arm to the unlatched position. The lever arm further comprises a positive stop arm 204 extending from the pivot end of the lever arm. The positive stop arm prevents the lever arm from opening past a maximal position by making contact with the pivot end of the unitarily formed body at the maximal position. Advantageously, if the lever arm is rotated past said maximal position, the contact between the positive stop arm and unitarily formed body will force the body to rotate downward, thereby depressing the release button end of the body. Thus, if the lever arm is forced past its maximal position, there is visual and tactile feedback to warn the user that the lever arm has traveled too far.

FIG. 7(b) shows a HDD bracket 100 from the top view inside the bezel 101 as the lever arm 200 is rotating between the open and closed positions. Specifically, FIG. 7(b) shows the bracket as a protrusion 202 from the lever arm makes contact with an edge of a cavity 501 formed in the unitarily formed body.

As the lever arm 200 is closing, the protrusion 202 that extends from the lever arm makes contact with an edge of a cavity 501 in the unitarily formed body 500. The contact between the protrusion and the edge of the cavity forces the unitarily formed body to pivot downward, which depresses the button end of the body and forces the locking mechanism 301 to clear from the path of the lever arm. Clearing the locking member from the path of the lever arm allows for smooth and consistent operation of a HDD bracket 100.

When opening the lever arm 200, the user depresses the button end of the unitarily formed body 500, thereby clearing the locking mechanism 301 from the path of the lever arm. Additionally, depressing the unitarily formed body clears the protrusion 202 from the edge of the cavity 501, allowing the lever arm to open freely. Generally, the spring 201 disposed at the pivot of the lever arm forces the arm to open automatically once its path is free from obstruction. Occasionally, the spring may not provide enough force to swing the lever arm open. In situations where the spring does not supply enough force to open the lever arm, and the user can not fit a finger between the lever arm and bezel 101, the button end of the unitarily formed body may be forcefully pressed in order to free the lever arm. In this case, force is transferred from the button end to the pivot end of the unitarily formed body, where the body makes contact with the lever arm near the pivot point of the lever arm.

FIG. 7(c) shows a HDD bracket with a unitarily formed body 500 comprising a release button 502, horn 503, and pivot 504 from the top view inside the bezel 101 when the lever arm 200 is in the latched position. When the lever arm is in the latched position, the shapes of the cavity 501 (as shown in FIG. 7(b)) and protrusion 202 allow the unitarily formed body to return to the body's natural upward position. In this position, the release button end of the body is again biased outward, and the locking member 301 impedes the path of the lever arm. In the latched position, the locking member is captured by the slotted end 203 of the lever arm 200, thereby securing the lever arm closed. In addition to allowing the unitarily formed body to return to the body's outward position, the shapes of the cavity and protrusion also help to secure the lever arm in the closed position.

Figure 8:
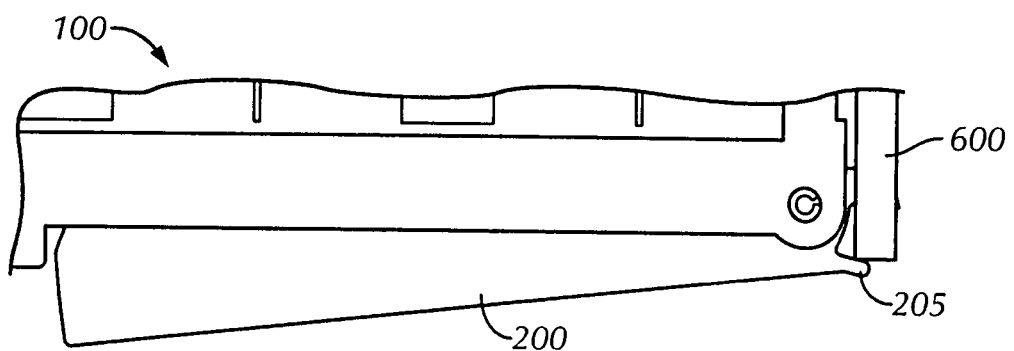
FIG. 8 shows a top view from inside of a HDD bracket in accordance with an embodiment of the present invention.

FIG. 8 shows a ledge 205 that may be disposed as an extension from the pivot end of the lever arm 200 to give an additional mechanical advantage for ejection of the HDD bracket 100. Upon opening, the ledge aids ejection by gaining leverage from a side wall adjacent to the HDD bracket. The end of the ledge 205 catches on the top or side of the side wall 600, thereby forcing the entire bracket outward to the user as the lever arm opens. This allows the user to use less force when removing the bracket, which may prevent damage from the user pulling on the lever arm to remove the bracket.

One or more embodiments of the present invention may include one or more of the following advantages: more secure retention of the lever arm 200; the mechanism is entirely internal, low profile, and does not impede airflow; the mechanism has a low part count and therefore low cost; the user-interface is intuitive and equivalent to what users are used to; the mechanism allows for smooth and consistent operation of the bracket; and the design of the mechanism is robust to manufacturing variation and inconsistencies despite the small size of HDD brackets.

While the invention has been described with respect to a limited number of embodiments, those skilled in the art, having benefit of this disclosure, will appreciate that other embodiments can be devised which do not depart from the scope of this invention as disclosed herein. Accordingly, the scope of the invention should be limited only by the attached claims.

What is claimed is:

1. A hard disk drive bracket comprising:
   a bezel;
   a lever arm attached to the bezel rotatably between a closed position against the bezel and an open position apart from the bezel, comprising an extension from the lever arm on the pivoting end; and
   a unitarily formed body attached to the bezel, wherein:
      a locking member disposed in the unitarily formed body and adapted to secure the lever arm closed;
      one end of the body functions as a release button arranged release the locking member from when the release button is depressed by rotating the unitarily formed body; and
      the body functions as a horn attached to the bezel rotatably between a natural position in which the locking member impedes the path of the lever arm and a forced position in which the locking member is clear of the path of the lever arm.

2. The hard disk drive bracket according to claim 1, wherein the extension from the pivoting end of the lever arm functions as a positive stop which prevents the lever arm from traveling past a maximum open position.

3. The hard disk drive bracket according to claim 2, wherein the positive stop forces the release button end of the unitarily formed body to depress if the lever arm rotates past the maximum open position.

4. The hard disk drive bracket according to claim 1, wherein depressing the release button end of the unitarily formed body supplies an opening force on the lever arm.

5. The hard disk drive bracket according to claim 1, wherein:
   the lever arm further comprises a ledge extending from the pivoting end of the lever arm;
   wherein upon release of the lever arm from the closed position, the ledge makes contact with a side wall disposed next to the hard disk drive bracket; and
   wherein the contact with the side wall creates leverage, thereby translating the rotational force of the opening lever arm into outward motion of the entire hard disk drive bracket.

6. The hard disk drive bracket of claim 5, wherein the lever arm and horn are adapted to function as a cam that converts motion of the lever arm to motion of the horn, thereby allowing the horn to interact with the release mechanism, depressing the release button.

7. The hard disk drive bracket of claim 6, wherein the lever arm has one or more protrusions that make contact with the horn during rotational motion of the lever arm.

8. The hard disk drive bracket of claim 7, wherein the horn has one or more cavities designed to receive the protrusions from the lever arm.

9. The hard disk drive bracket of claim 8, wherein the cavities in the horn and the protrusions from the lever arm secure the lever arm shut, thereby effectively serving as the locking member.

10. The hard disk drive bracket of claim 5, wherein the locking member comprises a wireform that translates between a forced releasing position when the release button is depressed and a natural latching position otherwise.

11. The hard disk drive bracket of claim 5, wherein the lever arm further comprises a slotted end adapted to receive the locking member to retain the lever arm in the closed position.

12. The hard disk drive bracket of claim 5, wherein the lever arm further comprises a spring attached to the bezel and adapted to be in a natural, unforced spring position when the lever arm is open, and a forced spring position when the lever arm is closed.

* * * * *